(12) United States Patent
Tsai et al.

(10) Patent No.: US 11,742,686 B2
(45) Date of Patent: Aug. 29, 2023

(54) BATTERY DEVICE AND BATTERY CHARGING SYSTEM

(71) Applicant: BASSO INDUSTRY CORP., Taichung (TW)

(72) Inventors: Cheng-En Tsai, Taichung (TW); Chun-Min Shih, Taichung (TW)

(73) Assignee: Basso Industry Corp., Taichung (TW)

( * ) Notice: Subject to any disclaimer, the term of this patent is extended or adjusted under 35 U.S.C. 154(b) by 375 days.

(21) Appl. No.: 17/092,406

(22) Filed: Nov. 9, 2020

(65) Prior Publication Data
US 2021/0143664 A1    May 13, 2021

(30) Foreign Application Priority Data

Nov. 11, 2019   (TW) ................................. 108214912

(51) Int. Cl.
| | |
|---|---|
| *H02J 7/00* | (2006.01) |
| *H03K 17/0812* | (2006.01) |
| *H01M 10/44* | (2006.01) |
| *H01M 10/42* | (2006.01) |

(52) U.S. Cl.
CPC ..... *H02J 7/007194* (2020.01); *H01M 10/425* (2013.01); *H01M 10/443* (2013.01); *H03K 17/08122* (2013.01); *H01M 2010/4271* (2013.01)

(58) Field of Classification Search
USPC ................. 320/106, 107, 108, 110, 136, 137
See application file for complete search history.

(56) References Cited

U.S. PATENT DOCUMENTS

2020/0086745 A1*   3/2020   Kim ........................ B60L 58/24

FOREIGN PATENT DOCUMENTS

| CN | 107710546 A | * | 2/2018 | .......... H01M 10/425 |
|---|---|---|---|---|
| CN | 110350262 A | * | 10/2019 | .......... H01M 10/425 |
| DE | 112016003836 T5 | * | 5/2018 | .............. B60L 15/20 |
| WO | WO-2016103606 A1 | * | 6/2016 | ............ H01M 10/48 |

\* cited by examiner

*Primary Examiner* — Brian Ngo
(74) *Attorney, Agent, or Firm* — Burris Law, PLLC

(57) ABSTRACT

A battery device includes a battery unit, a temperature port, a temperature sensitive component, a switch component and a battery management unit. The temperature sensitive component senses a temperature of the battery unit, and provides a temperature indication signal at the temperature port. The switch component is electrically connected to the temperature sensitive component. When the battery device operates abnormally, the battery management unit controls the switch component to make the switch component stop provision of the temperature indication signal at the temperature port.

8 Claims, 2 Drawing Sheets

BATTERY DEVICE AND BATTERY CHARGING SYSTEM

CROSS-REFERENCE TO RELATED APPLICATION

This application claims priority of Taiwanese Invention Patent Application No. 108214912, filed on Nov. 11, 2019.

FIELD

The disclosure relates to a battery device and a battery charging system.

BACKGROUND

Nowadays, rechargeable batteries (e.g., lithium-ion batteries) have been widely used in various electric tools. Rechargeable batteries are sensitive to temperature, and thus some (e.g., a power bank) have a port that indicates a temperature condition thereof. However, rechargeable batteries may be affected by various abnormal conditions other than abnormal temperature condition, such as overcurrent and/or overvoltage, which may shorten the battery life. Therefore, it may be insufficient for rechargeable batteries to only reveal its temperature condition.

SUMMARY

Therefore, an object of the disclosure is to provide a battery device that can reveal whether various aspects of its operation or performance is normal or abnormal without adding additional ports.

According to the disclosure, the battery device includes a battery unit, a power port unit, a temperature port, a temperature sensitive component, a switch component and a battery management unit. The battery unit has a positive electrode and a negative electrode. The power port unit includes a charging port and a negative electrode port which are electrically connected to the positive electrode and the negative electrode of the battery unit, respectively. The temperature sensitive component is disposed to sense a temperature of the battery unit, is electrically connected to the temperature port, and is configured to provide a temperature indication signal at the temperature port. The temperature indication signal is indicative of the temperature sensed by the temperature sensitive component. The switch component is electrically connected to the temperature sensitive component and is disposed to control provision of the temperature indication signal at the temperature port. The battery management unit is electrically connected to the temperature sensitive component for receiving the temperature indication signal therefrom, is electrically connected to the switch component for controlling operation thereof, and is configured to send a switch control signal to the switch component to make the switch component stop provision of the temperature indication signal at the temperature port when an operation state of the battery device is an abnormal state.

Another object of the disclosure is to provide a battery charging system that includes the battery device of this disclosure, and a charging device. The charging device is electrically connected to the charging port, the negative electrode port and the temperature port, and is configured to charge the battery device via the charging port and the negative electrode port upon detecting provision of the temperature indication signal at the temperature port, and to stop charging the battery device upon detecting that the temperature indication signal is not provided at the temperature port.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
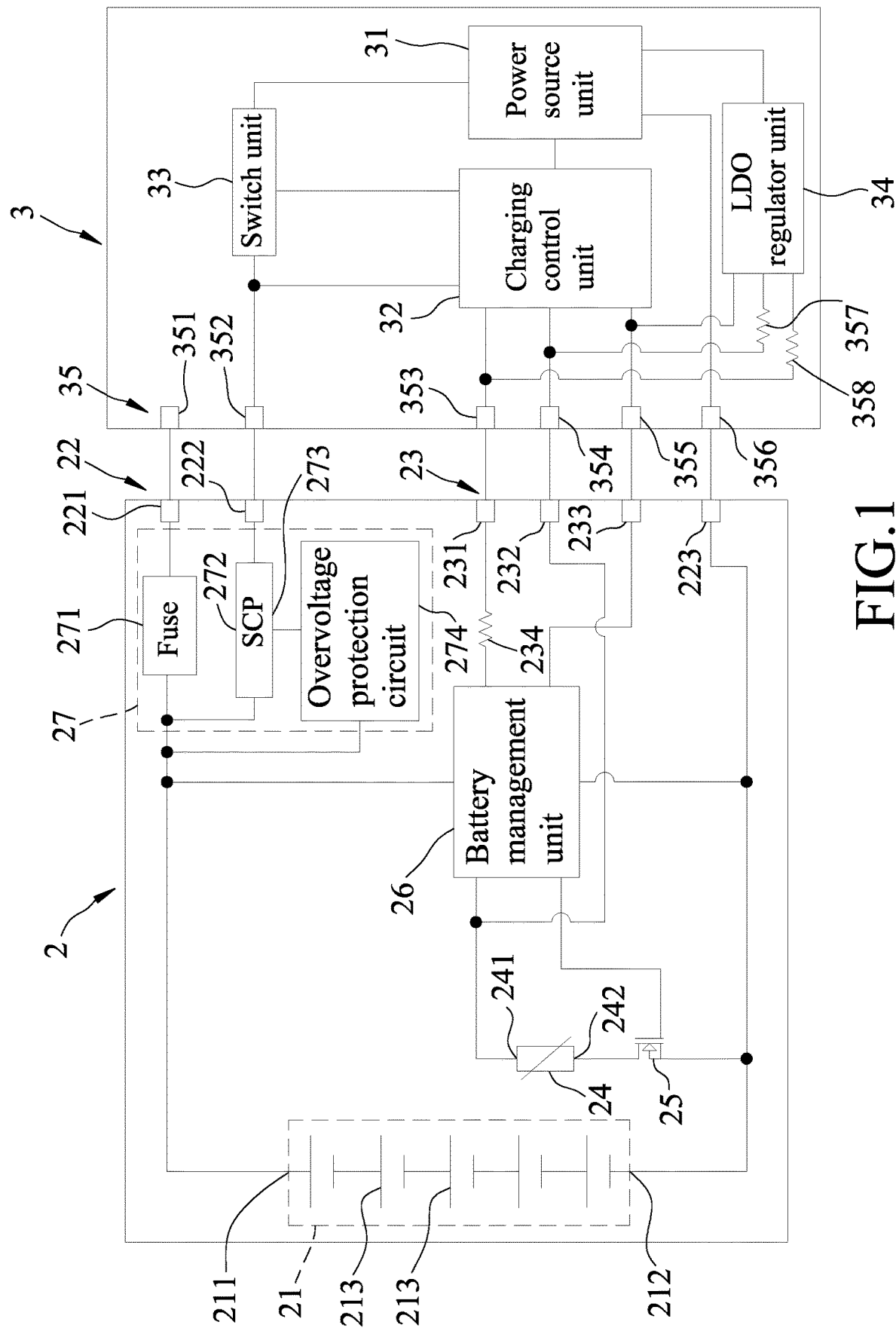
FIG. 1 is a schematic circuit block diagram illustrating an embodiment of a battery charging system according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
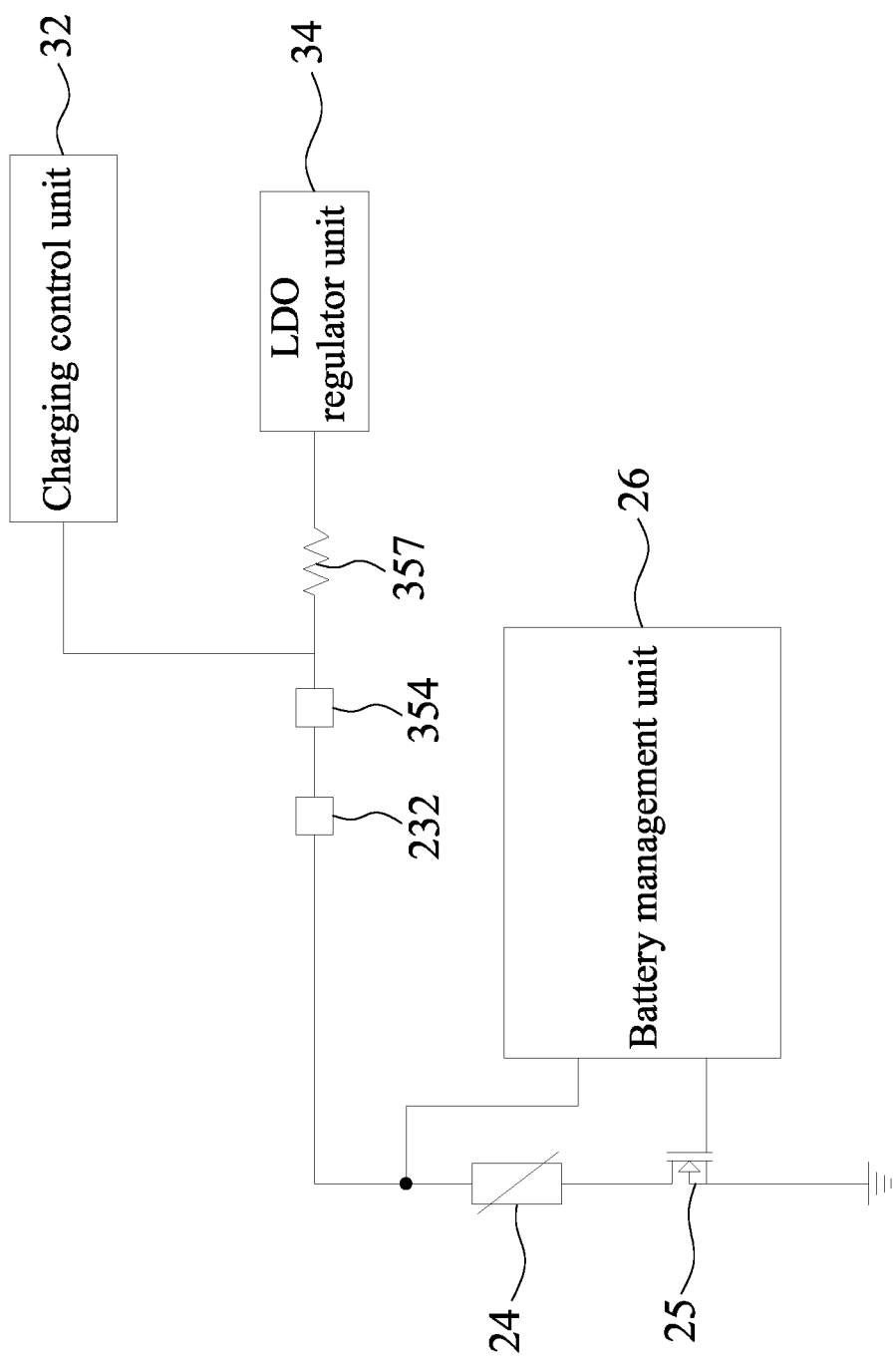
FIG. 2 is a schematic circuit diagram illustrating the use of a temperature port of a battery device of the embodiment.

Referring to FIGS. 1 and 2, an embodiment of a battery charging system according to this disclosure includes a battery device 2 and a charging device 3.

The battery device 2 includes a battery unit 21, a power port unit 22, a functional port unit 23, a temperature sensitive component 24, a switch component 25, and a battery management unit 26 that is realized using a battery management system (BMS).

In this embodiment, the battery unit 21 is a rechargeable battery unit that includes one or more battery cells 213, and has a positive electrode 211 and a negative electrode 212.

The power port unit 22 includes a positive electrode port 221, a charging port 222 and a negative electrode port 223. The positive electrode port 221 and the charging port 222 are electrically connected to the positive electrode 211, and the negative electrode port 223 is electrically connected to the negative electrode 212.

The functional port unit 23 includes an identification port 231, a temperature port 232 and a wakeup port 233. The identification port 231 is electrically connected to the battery management unit 26 through a resistor 234, and is disposed for signal communication necessary to perform an identification process between the battery device 2 and an electric device (e.g., the charging device 3 or an electric tool that uses the battery device 2 as a power source) that is connected to the battery device 2. The temperature identification port 232 is disposed to provide a temperature indication signal that corresponds to a temperature of the battery unit 21. The wakeup port 233 is disposed to receive a wakeup signal for waking the battery management unit 26 that is operating in a standby mode.

The temperature sensitive component 24 is disposed to sense the temperature of the battery unit 21, so as to generate the temperature indication signal that is indicative of the temperature sensed by the temperature sensitive component 24 and that is to be provided at the temperature port 232. In this embodiment, the temperature sensitive component 24 is realized using a negative temperature coefficient (NTC) thermistor, and has a first terminal 241 and a second terminal 242, where the first terminal 241 is electrically connected to the battery management unit 26 and the temperature port 232.

The switch component 25 and the temperature sensitive component 24 are connected in series between the temperature port 232 and the negative electrode port 223 of the power port unit 22. In this embodiment, the switch component 25 is realized using an N-type metal-oxide-semiconductor field-effect transistor (MOSFET) that has a source electrode electrically connected to the negative electrode port 223, a drain electrode electrically connected to the second terminal 242 of the temperature sensitive component 24, and a gate electrode electrically connected to the battery management unit 26 for receiving a switch control signal that controls the switch component 25 to conduct or not conduct. In such configuration, the temperature indication signal is provided from the negative electrode 212 to the temperature port 232 through the switch component 25 and the temperature sensitive component 24 when the switch component 25 conducts, and is not provided to the temperature port 232 when the switch component 25 does not conduct.

In this embodiment, since the switch component 25 is an N-type MOSFET, the switch component 25 conducts when the switch control signal is at a low voltage level, and does not conduct when the switch control signal is at a high voltage level. In some embodiments, the switch component 25 may be realized using a P-type MOSFET of which the source electrode and the drain electrode are electrically and respectively connected to the positive electrode port 221 and the temperature sensitive component 24, and which conducts when the switch control signal is at a high voltage level, and does not conduct when the switch control signal is at a high voltage level.

In one embodiment, the switch component 25 and the temperature sensitive component 24 are connected in parallel, and the switch component 25 controls provision of the temperature indication signal to the temperature port 232 by pulling a voltage level at the first terminal 241 of the temperature sensitive component 24 to a high voltage level (e.g., connection to the positive electrode 211) or a low voltage level (e.g., connection to the negative electrode 212).

The battery management unit 26 is electrically connected to the positive electrode port 221, the charging port 222, the negative electrode port 223, the identification port 231, the temperature port 232, the wakeup port 233, the first terminal 241 of the temperature sensitive component 24, and the gate electrode of the switch component 25. The battery management unit 26 is configured to output the switch control signal that makes the switch component 25 conduct so as to provide the temperature indication signal at the temperature port 232 when an operation state of the battery device 2 is a normal state, and outputs the switch control signal that makes the switch component 25 not conduct so as to stop provision of the temperature indication signal at the temperature port 232 when the operation state is an abnormal state.

In one embodiment, the abnormal state includes that the battery management unit 26 determines that the temperature indication signal indicates that the temperature sensed by the temperature sensitive component 24 is higher than a predetermined temperature threshold. The predetermined temperature threshold may be determined based on an optimum operation temperature for the battery unit 21.

In one embodiment, the battery management unit 26 detects a voltage and/or a current of the battery unit 21, and the abnormal state includes that the battery management unit 26 determines that the voltage and/or the current of the battery unit 21 does not fall within a predetermined range.

In one example, the battery management unit 26 detects a voltage of each of the battery cells 213, and the abnormal state may refer to that the voltages of the battery cells 213 are unbalanced (i.e., a difference between the voltages of any two of the battery cells 213 is greater than a predetermined voltage value). In one example, the abnormal state includes overcurrent discharge, overvoltage, undervoltage, and/or other abnormality of the battery unit 21 or battery cells 213.

In some embodiments, the abnormal state may include other abnormality in terms of operation. For example, one abnormality is that the wakeup function is not performed normally (e.g., the battery management unit 26 is not awaken when the wakeup port 233 receives the wakeup signal). In this embodiment, the battery management unit 26 is configured to send the switch signal that makes the switch component 25 stop provision of the temperature indication signal at the temperature port 232 when operating in the standby mode, so the temperature indication signal will not be provided at the temperature port 232 when the wakeup function is abnormal.

In this embodiment, the battery device 2 further includes a protection unit 27 that includes a fuse 271 electrically connected between the positive electrode port 221 and the positive electrode 211 of the battery unit 21, and a protection circuit 272 electrically connected between the charging port 222 and the positive electrode 211 of the battery unit 21. The protection circuit 272 includes a self control protector (SCP) 273 and an overvoltage protection circuitry 274 that is electrically connected to the SCP 273. The fuse 271 and the protection circuit 272 may provide overvoltage and/or overcurrent protection between the positive electrode port 221 and the positive electrode 211 of the battery unit 21, and between the charging port 222 and the positive electrode 211 of the battery unit 21. Usually, a structure of the overvoltage protection circuitry 274 may be suggested in a datasheet of the SCP 273 that is used in the battery device 2, so as to enable the SCP 273 to achieve the desired effect. Details on the operation of the protection circuit 272 should be familiar to those skilled in the art, and are thus omitted herein for the sake of brevity.

The charging device 3 includes a power source unit 31, a charging control unit 32, a switch unit 33, a low-dropout (LDO) regulator unit 34, and a charging port unit 35.

The power source unit 31 is used to provide electric power for charging the battery device 2. The charging control unit 32 includes a controller to control operation of the switch unit 33, so as to permit the switch unit 33 to block output of the electric power that is provided by the power source unit 31. The LDO regulator unit 34 is configured to provide a stable voltage of, for example, 5 volts.

The charging port unit 35 includes a floating dummy port 351, a charging port 352, an identification port 353, a temperature port 354, a wakeup port 355 and a negative electrode port 356 that respectively correspond in position to the positive electrode port 221, the charging port 222, the identification port 231, the temperature port 232, the wakeup port 233 and the negative electrode port 223 of the battery device 2 when the charging device 3 is in connection with the battery device 2. In this embodiment, the charging port 352 is electrically connected to the power source unit 31 through the switch unit 33, the negative electrode port 356 is electrically connected to the power source unit 31, the temperature port 354 is electrically connected to the LDO regulator 34 through a resistor 357, and the identification port 353 is electrically connected to the LDO regulator 34 through a resistor 358.

When the charging device 3 is used to charge the battery device 2, the identification port 353, the temperature port 354 and the wakeup port 355 receive electric power from the LDO regulator 34, and the charging control unit 32 detects the voltages at the identification port 353, the temperature port 354 and the wakeup port 355, so as to identify a type of the battery device 2 based on the voltage at the identification port 353, to determine the temperature of the battery unit 21 based on the voltage at the temperature port 354, and to determine whether the battery management unit 26 is in the standby mode based on the voltage at the wakeup port 355 and wake the battery management unit 26 if the determination is affirmative. After identifying the type of the battery device 2, and determining that the temperature of the battery unit 21 is normal (i.e., equal to or lower than the predetermined temperature threshold) and that the battery management unit 26 operates normally, the charging control unit 32 detects a voltage at the charging port 352 to determine a current voltage of the battery unit 21, and controls the switch unit 33 to conduct to charge the battery unit 21 through the charging port 352 and the negative electrode port 356. Since the procedures of identifying the battery type and waking the battery management unit 26 should be familiar to those skilled in the art, details thereof are omitted herein for the sake of brevity.

FIG. 2 shows a circuit schematic diagram where the temperature port 232 of the battery device 2 is connected to the temperature port 354 of the charging device 3 to illustrate how the temperature port 232 is used in this embodiment. Referring to both FIG. 1 and FIG. 2, when the operation state of the battery device 2 is the normal state, the battery management unit 26 outputs a control signal to make the switch component 25 conduct, so the voltage provided by the LDO regulator unit 34 is divided by the resistor 357, the temperature sensitive component 24 and the switch component 25 to generate a division voltage at the temperature ports 354, 232. The division voltage is lower than the voltage outputted by the LDO regulator unit 34, and serves as the temperature indication signal in this embodiment. The charging control unit 32 and the battery management unit 26 can calculate the temperature of the battery unit 21 based on the division voltage since the resistance of the temperature sensitive component 24 varies with the temperature of the battery unit 21. Accordingly, the charging control unit 32 and the battery management unit 26 can determine whether the temperature of the battery unit 21 falls within a normal range (e.g., equal to or lower than the predetermined temperature threshold). If the determinations made by the charging control unit 32 and the battery management unit 26 are both affirmative, the charging device 3 controls the switch unit 33 to conduct so as to charge the battery device 2.

When the temperature of the battery unit 21 is higher than the predetermined temperature threshold, the charging control unit 32 may detect that the battery device 2 operates abnormally in one of two approaches. In the first approach, the charging control unit 33 calculates the temperature of the battery unit 21 based on the division voltage at the temperature port 354, and is thus able to know that the temperature thus calculated is higher than the predetermined temperature threshold (the operation state of the battery device 2 is thus determined to be the abnormal state). In the second approach, the battery management unit 26 detects that the temperature of the battery unit 21 is higher than the predetermined temperature threshold and thus sends the switch control signal to make the switch component 25 not conduct, so that the charging control unit 32 can become aware of the abnormality of the battery device 2 by detecting a voltage that has a magnitude close to that of the voltage outputted by the LDO regulator 34 (e.g., 5 volts in this embodiment) at the temperature port 354 (which means that the temperature indication signal is not provided at the temperature port 354), and control the switch unit 33 to not conduct, so as not to charge the battery device 2.

When the battery management unit 26 that operates in the standby mode receives the wakeup signal from the wakeup port 233 but is not awaken normally, which is a type of abnormality (the wakeup function is abnormal) so the battery device 2 is in the abnormal state, the battery management unit 26 continues sending the switch control signal that makes the switch component 25 not conduct, so that the charging control unit 32 will become aware of the abnormality of the battery device 2 by detecting a voltage that has a magnitude close to that of the voltage outputted by the LDO regulator 34 (e.g., 5 volts in this embodiment) at the temperature port 354, and control the switch unit 33 to not conduct, so as not to charge the battery device 2.

Furthermore, when the battery management unit 26 detects that the battery unit 21 is in other predefined abnormal conditions, such as overcurrent discharging, overvoltage, undervoltage, etc., the battery management unit 26 outputs the switch control signal that makes the switch component 25 not conduct, so as to stop provision of the temperature indication signal at the temperature port 232. Accordingly, the charging control unit 32 can become aware that the battery device 2 operates abnormally based on the voltage at the temperature port 354.

When the battery device 2 is installed on an electric tool (not shown) to serve as a power source, the electric tool may use the same mechanism to determine whether the battery device 2 operates normally, so as to determine whether the electric tool needs to stop operating. In practice, the electric tool may detect the voltage at the temperature ports 232, 354 to determine whether the temperature indication signal is provided at the temperature port 232. Upon determining that the temperature indication signal is provided at the temperature port 232, the electric tool receives electric power provided by the battery device 2 through the positive electrode port 221 and the negative electrode port 223. When determining that the temperature indication signal is not provided at the temperature port 232, the electric tool may block receipt of the electric power from the battery device 2.

In summary, by using the switch component 25 that is electrically connected to the temperature sensitive component 24, the battery management unit 26 can control provision of the temperature indication signal at the temperature port 232 based on the operation state of the battery device 2, so voltage at the temperature port 232 can reveal not only the temperature of the battery unit 21 but also the operation state of the battery device 2. As a result, additional ports are not required while additional functions (e.g., monitoring whether the battery device 2 operates normally) are implemented.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A battery charging system, comprising:
   a battery device including:
      a battery unit that has a positive electrode and a negative electrode;
      a temperature port;
      a temperature sensitive component that is disposed to sense a temperature of said battery unit, that is electrically connected to said temperature port, and that is configured to provide a temperature indication signal at said temperature port, wherein the temperature indication signal is indicative of the temperature sensed by said temperature sensitive component;
      a switch component that is electrically connected to said temperature sensitive component and that is disposed to control provision of the temperature indication signal at said temperature port;
      a battery management unit that is electrically connected to said temperature sensitive component for receiving the temperature indication signal therefrom, that is electrically connected to said switch component for controlling operation thereof, and that is configured to send a switch control signal to said switch component to make said switch component stop provision of the temperature indication signal at said temperature port when an operation state of said battery device is an abnormal state; and
      a power port unit that includes a charging port electrically connected to said positive electrode of said battery unit, a positive electrode port electrically connected to said positive electrode of said battery unit, and a negative electrode port electrically connected to said negative electrode of said battery unit, wherein said charging port, said positive electrode port and said negative electrode port are spaced apart from each other; and
   a charging device that is adapted to be electrically connected to said charging port, said negative electrode port and said temperature port when charging said battery unit, and that is configured to charge said battery device via said charging port and said negative electrode port upon detecting provision of the temperature indication signal at said temperature port, and to stop charging said battery device upon detecting that the temperature indication signal is not provided at said temperature port;
   wherein said battery device is configured to supply electric power through said positive electrode port and said negative electrode port of said power port unit.

2. The battery charging system of claim 1, wherein said temperature sensitive component is a thermistor that has two ends electrically connected to said temperature port and said switch component, respectively.

3. The battery charging system of claim 1, wherein said battery unit has a positive electrode and a negative electrode;
   said battery device further comprising a power port unit that includes a charging port and a negative electrode port which are electrically connected to said positive electrode and said negative electrode of said battery unit, respectively;
   wherein said switch component and said temperature sensitive component are connected in series between said temperature port and said power port unit.

4. The battery charging system of claim 3, wherein said switch component is a metal-oxide-semiconductor field-effect transistor that has a gate electrode electrically connected to said battery management unit for receiving the switch control signal therefrom.

5. The battery charging system of claim 3, wherein said battery management unit outputs the switch control signal that makes said switch component conduct when the operation state is a normal state, and outputs the switch control signal that makes said switch component not conduct when the operation state is the abnormal state.

6. The battery charging system of claim 1, wherein the abnormal state includes that said battery management unit determines that the temperature indication signal received indicates that the temperature sensed by said temperature sensitive component is higher than a predetermined temperature threshold.

7. The battery charging system of claim 1, further comprising a wakeup port that is disposed to receive a wakeup signal to wake said battery management unit when said battery management unit operates in a standby mode where said battery management unit sends the switch signal that makes said switch component stop provision of the temperature indication signal at said temperature port, and that is electrically connected to said battery management unit for transmitting the wakeup signal thereto.

8. The battery charging system of claim 1, wherein the abnormal state includes that said battery management unit detects that one of a voltage and a current of said battery unit does not fall within a predetermined range.

* * * * *